United States Patent [19]

Machesney et al.

[11] Patent Number: 5,670,388
[45] Date of Patent: Sep. 23, 1997

[54] METHOD OF MAKING CONTACTED BODY SILICON-ON-INSULATOR FIELD EFFECT TRANSISTOR

[75] Inventors: Brian John Machesney, Burlington, Vt.; Jack Allan Mandelman, Stormville, N.Y.; Edward Joseph Nowak, Essex, Vt.

[73] Assignee: International Business Machines Corporation, Armonk, N.Y.

[21] Appl. No.: 542,592

[22] Filed: Oct. 13, 1995

Related U.S. Application Data

[62] Division of Ser. No. 310,691, Sep. 22, 1994, Pat. No. 5,587,604.

[51] Int. Cl.⁶ .................................................. H01L 21/84
[52] U.S. Cl. ........................... 437/21; 437/41; 437/62; 437/984; 148/DIG. 150
[58] Field of Search ................. 437/21, 40 TFT, 437/41 TFT, 62, 83, 228 W, 984, 915; 148/DIG. 150, DIG. 164

[56] References Cited

U.S. PATENT DOCUMENTS

| | | | |
|---|---|---|---|
| 4,396,933 | 8/1983 | Magdo et al. | 357/50 |
| 4,554,570 | 11/1985 | Jastrzebski et al. | 257/331 |
| 4,814,287 | 3/1989 | Takemoto et al. | 437/62 |
| 4,946,799 | 8/1990 | Blake et al. | 148/DIG. 150 |
| 5,055,898 | 10/1991 | Beilstein, Jr. et al. | 257/350 |
| 5,298,773 | 3/1994 | Woodruff | 257/347 |
| 5,317,181 | 5/1994 | Tyson | 257/347 |
| 5,326,991 | 7/1994 | Takasu | 257/350 |
| 5,405,795 | 4/1995 | Beyer et al. | 148/DIG. 150 |
| 5,591,650 | 1/1997 | Hsu et al. | 437/21 |

FOREIGN PATENT DOCUMENTS 7-94721   4/1995   Japan.

*Primary Examiner*—Charles L. Bowers, Jr.
*Assistant Examiner*—Leon Radomsky
*Attorney, Agent, or Firm*—James M. Leas

[57] ABSTRACT

Structures and methods are presented for forming a body-substrate connector for an SOI FET. The connector is formed substantially co-aligned with the gate conductor on a side of the device that does not interfere with source and drain. The body is thus held close to the substrate potential and the connector provides a path for majority carriers to quickly leave the body. By contacting the body of the SOI MOSFET device in a manner that does not perturb the charge imaged by the gate, parasitic bipolar effects are eliminated while maintaining the desirable attributes of SOI MOSFET devices, such as low substrate bias sensitivity and steep sub-threshold slope. By forming the connector substantially co-aligned with the gate conductor the connection uses little or no surface area.

18 Claims, 14 Drawing Sheets

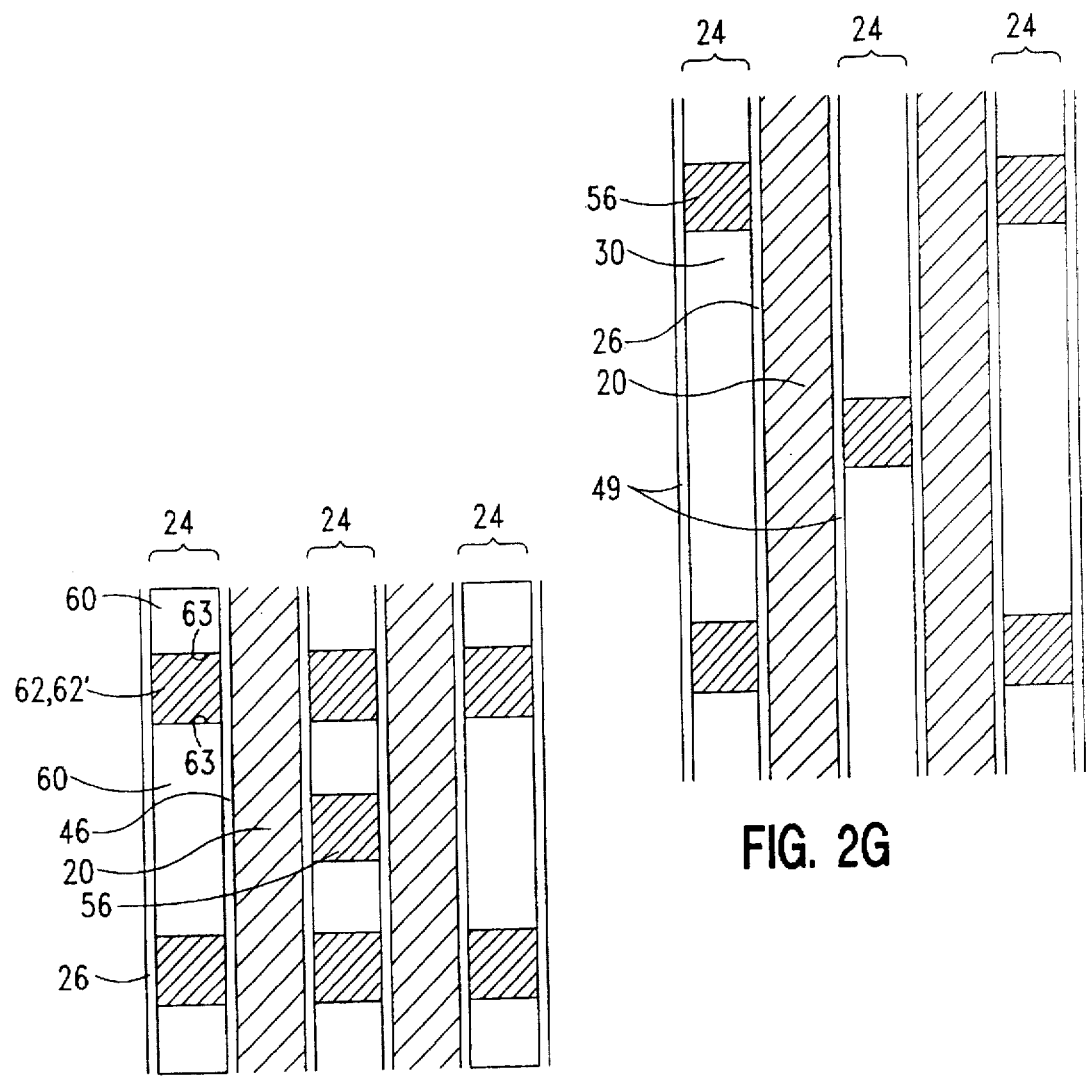
FIG. 2G
FIG. 2H
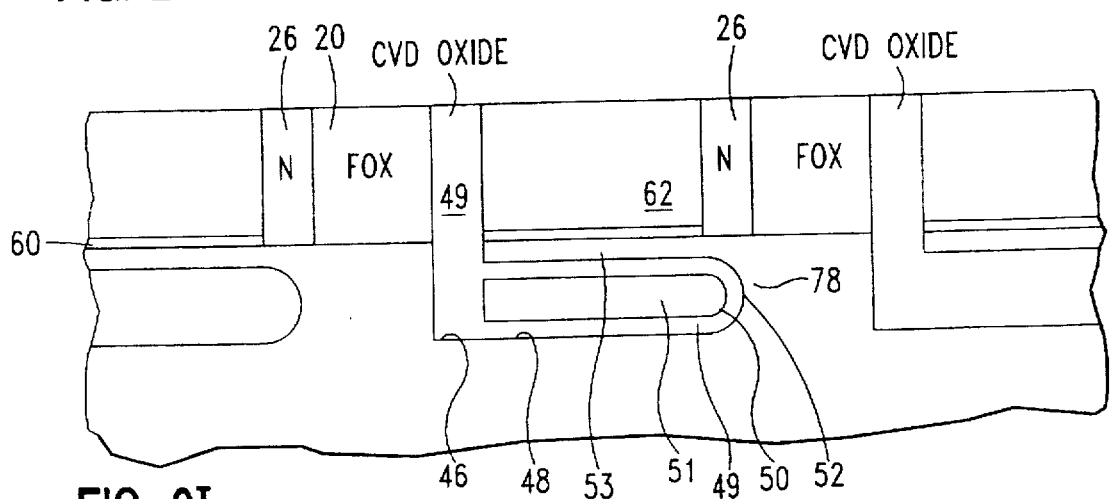
FIG. 2I

METHOD OF MAKING CONTACTED BODY SILICON-ON-INSULATOR FIELD EFFECT TRANSISTOR

This is a divisional of application Ser. No. 08/310,691 filed on Sep. 22, 1994, U.S. Pat. No. 5,587,604.

FIELD OF THE INVENTION

This invention generally relates to silicon-on-insulator (SOI) field effect transistors (FETs). More particularly, it relates to SOI FETs having a contact to the body of the transistor. Even more particularly, it relates to SOI FETs having a contact linking the body of the transistor with the substrate.

BACKGROUND

Conventional SOI FETs offer advantages over bulk devices, but they also offer a distinct disadvantage. The advantages include latchup immunity, radiation hardness, reduced junction capacitance, and reduced junction leakage currents. In addition fully depleted SOI devices offer additional advantages. They provide reduced short channel effect, near ideal sub-threshold slope, increased transconductance, and reduced threshold voltage (Vt) sensitivity to changes in body doping, channel length, temperature, and substrate voltage. Additional advantages are that the kink effect and Vt shifts caused by body charging are significantly reduced in fully depleted devices compared to partially depleted devices. Fully depleted SOI devices are those in which the layer of semiconductor is sufficiently thin that the entire thickness of the body region is depleted of majority carriers when in the off state and both diffusions are at ground.

But conventional SOI FETs have a "floating body" in which the body or channel region of the FET is located on insulator and not electrically connected to a fixed potential. Floating body SOI devices can experience high leakage current and parasitic bipolar action. This disadvantage can be eliminated by providing a contact to the substrate or to the surface to tie the body to a fixed potential.

Body-substrate contacts for SOI devices have been formed located under the gate, as illustrated in U.S. Pat. Nos. 4,396,933 to Magdo et al. ("the '933 patent"), and 4,814,287 to Takemoto et al. ("the '287 patent"). However, with SOI devices having the body-substrate contact in the channel region, the gate remains capacitively coupled to both bulk charge and SOI charge, detracting from the advantages of an SOI structure.

In addition to the capacitive coupling problem, applicants found that substrate bias sensitivity in a DRAM cell is about as high for SOI devices with a body-substrate contact in the channel region as for bulk devices. Source to substrate voltage, the back bias, increases as the node is charged (the node is the transistor electrode tied to the cell capacitor. When writing a high level to the capacitor, the node is the source of the transistor). Depending on the substrate sensitivity, as this back bias increases, Vt increases. With fixed gate potential, the device starts turning itself off as the node potential increases due to increasing Vt and decreasing Vgs. This means that a higher gate potential is needed to keep the device on. To provide a higher gate potential, the chip must be designed with a higher wordline voltage (Vgs). However, a higher Vgs introduces reliability concerns such as hot electron effects and gate-dielectric breakdown. All else being equal, a chip with a higher Vgs dissipates more power, a major problem for high speed logic and memory chips. Thus, by not obtaining the reduced substrate sensitivity available to SOI devices, key performance advantages of SOI are sacrificed in these previous attempts to achieve a body-substrate contact.

Other schemes for body contact require that the channel region have a heavily doped layer over the insulation, and these schemes, like the body contacts illustrated by the '933 and '287 patents, permit bulk charges always to be available, preventing the device from reaching full depletion. Still other schemes have a body contact to the surface that adds significantly to chip area, defeating some of the advantage of SOI.

Thus, the prior art has provided SOI structures having a floating body. The prior art has also attempted to solve the floating body problem by providing body contacts. But the body contacts of the prior art either are located so that they avoid using additional chip area but prevent full depletion, or are located so that they consume a significant amount of additional chip area. Therefore, improvement is needed to retain the advantages of SOI without the disadvantages either of the floating body or of other schemes for a body contact.

SUMMARY OF THE INVENTION

It is therefore an object of the present invention to provide structure and method of forming a body contact that does not prevent the device from reaching full depletion and that does not require substantial surface area.

It is another object of this invention to provide structure and method to form a subminimum dimension body contact located on a side of the gate substantially co-aligned with the gate.

It is a feature of the present invention that the body-to-substrate contact is formed substantially outside the range of the gate electric field when the FET is in operation.

These and other objects and features of the invention are accomplished with a semiconductor structure which comprises an FET located on a semiconductor substrate. The semiconductor substrate has a buried dielectric that defines lower and upper regions of the substrate, the upper region being monocrystalline. The FET comprises a gate dielectric located on a portion of the upper region, a gate located above the gate dielectric, the gate having three sides. A source and a drain diffusion are within the upper region, the source along the first side of the gate, the drain along the second side. An electrical connection exists between the upper region and the lower region, the connection having an edge substantially co-aligned with the third side of the gate.

In a further aspect, the present invention includes a method of forming a silicon-on-insulator FET comprising the steps of providing a semiconductor substrate having a buried dielectric that defines lower and upper regions of the substrate; forming a connection between the lower and upper regions of the substrate; forming a gate dielectric on a portion of the upper region; forming a gate on the gate dielectric, the gate having 3 sides; and forming a source and a drain in the upper region and leaving a body region therebetween, in which the source is aligned to the first side of the gate and the drain is aligned to the second side; wherein the step of forming the lower and upper regions involves forming the connection substantially co-aligned with the third side of the gate.

As used in this application the phrase, the connection is "substantially co-aligned" with the gate means that the connection is aligned to an original edge to which the gate is also aligned (or either or both are aligned to an edge, such as a spacer edge, derived from the original edge). Separate photolithography steps are avoided; both structures are formed from a single masking step aligned to the same mask edge. Little or no additional surface area is consumed compared to processes requiring separate photolithography steps for both structures.

In a preferred embodiment, the body connection is located on a side of the FET that does not interfere with the source and the drain and is formed to a portion of the upper region having an electric field much lower than that directly under the gate. The connection connects the transistor body to the substrate, which is held close to a fixed potential. It is best if the body connection does not extend into the region directly below the gate dielectric and gate conductor. In fact, it is preferable that the body connection be spaced away from the edge of the gate to a position where the electric field is still weaker. In an array, such as a DRAM, the connection is located below the wordline, but thick oxide separates the wordline from the connection. Typically, the capacitance of thick oxide is about ten times weaker than the capacitance of gate dielectric. So, when the wordline and gate of the FET is charged to its full potential, the body connection experiences only a small or negligible portion of the gate electric field extending from the overpassing wordline. The fringing field outside of the capacitor plates rapidly drops with distance from the plate edge, and the invention provides means to space the connection from the plate edge. Thus, the coupling between the body connection and either the wordline or the gate is substantially reduced compared to contacts located under the gate and its thin dielectric.

By contacting the body of the SOI MOSFET device in a manner that does not substantially perturb the charge imaged by the gate, parasitic bipolar effects are eliminated while the desirable attributes of SOI MOSFET devices are maintained. Since the body connection is out of the active gated region between source and drain, serving only to set the body potential and to allow an exchange of carriers between substrate and body, the advantages of SOI MOSFET devices which were mentioned earlier are preserved. The body can be fully depleted and the source-to-substrate voltage sensitivity of the threshold voltage is substantially reduced.

BRIEF DESCRIPTION OF THE DRAWINGS

FIGS. 2a–2e and 2i are cross-sectional views showing a set of process steps for making an SOI device of the present invention on a standard substrate.

FIGS. 2f–2h and 2j–2k are planar views showing the structure at several steps in the process for making an SOI device of the present invention on a standard substrate using a doping ion implant.

DETAILED DESCRIPTION OF THE INVENTION

The present invention provides structures and methods of forming an SOI FET with a body-substrate connection that does not prevent the device from reaching full depletion and that does not require substantial surface area. The connection is located adjacent to the FET but in a region where the capacitive coupling between gate and connection is substantially reduced compared to the coupling to charge located under the gate. The connection is located substantially co-aligned with a side of the FET not occupied by the source or drain. The term "substantially co-aligned" as defined above means that both the connection and this side of the FET were both formed aligned to a common edge or to edges derived therefrom. Lateral implant straggle, hot process steps, etches, the formation of spacers, and other process steps may of course make them move out of actual alignment, but they are still considered to be "self-aligned" to the common edge and substantially co-aligned with each other since their positions were not determined by separate masks.

To achieve full depletion in normal operation with an acceptably low off current, the structure must have an appropriate combination of SOI thickness, body doping, and gate work function. Typically very thin SOI layers are used, in the range from 5 nm to 500 nm, more preferably in the range from 5 nm to 100 nm. Body doping is generally in the $10^{17}$ range. Any commonly used gate material is suitable if the thickness and doping are adjusted for the material's work function so that the body is fully depleted at zero gate voltage. For example, for an nFET with a gate having a mid-gap gate work function, full depletion occurs at SOI thicknesses of less than 400 Å. To produce a practical value of off current for high performance devices, at a thickness of 400 Å the body doping is p type at about $3.5 \times 10^{17}$; at a thickness of 300 Å, about $2.5 \times 10^{17}$; and at a thickness of 200 Å, about $7.0 \times 10^{16}$. For an n+ gate, a fully depleted device with a useful off current for a high performance device can be made if the thickness is less than 200 Å. At 200 Å the doping needs to be about $1.5 \times 10^{17}$.

Figure 1A:
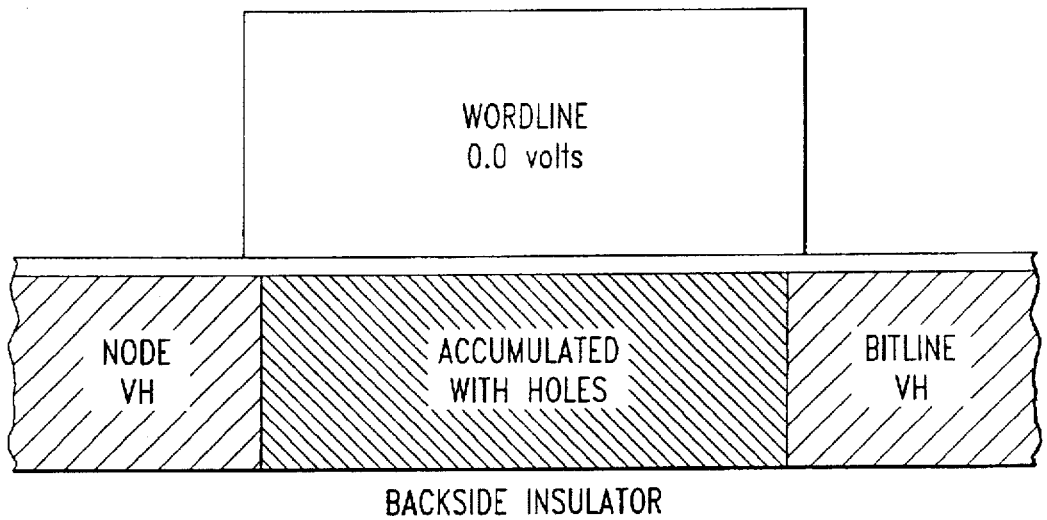
FIGS. 1a–1b are cross-sectional views showing an SOI device of the prior art.
Figure 1B:
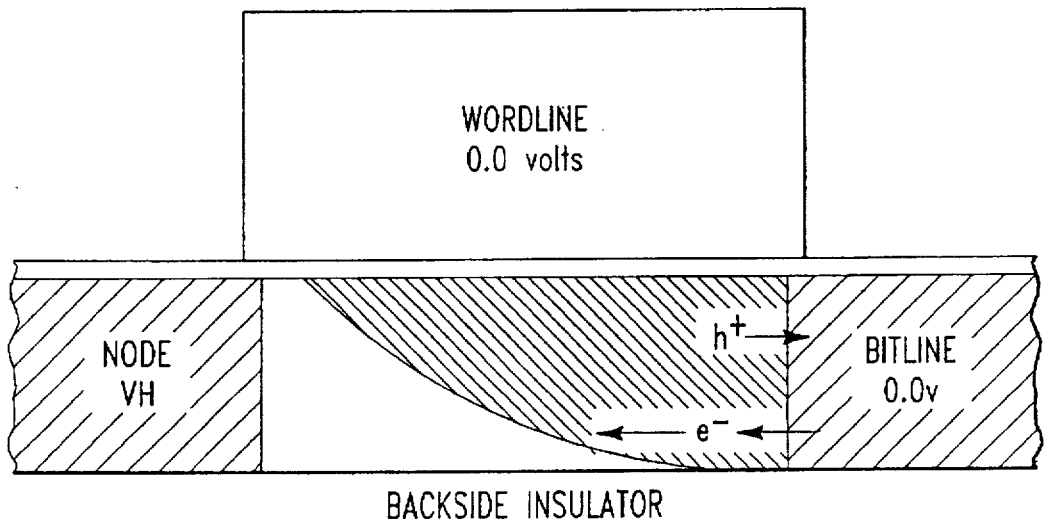

The need for a body contact, its location, and its size and structure are important considerations for SOI devices. First we will address the need for a body contact, then we will present the invention providing improved location, size, and structure. Applicants have observed strong parasitic bipolar action in one floating body SOI device in an array when another array device is accessed. Consider the case of an n-channel DRAM array device that is not accessed but shares the same bitline with another array device that is accessed (FIG. 1a–1b). The device is assumed to have been in an inactive state for a period of time with its gate (or wordline) low and both its storage node and its bitline high. Since in this condition the gate (wordline) is at a lower potential than the body, holes will accumulate in the body as a result of thermal generation and the body potential will leak up towards the potential of the diffusions (FIG. 1a).

Although the wordline of the device in FIG. 1b is held low, the device begins to conduct when the bitline is pulled down because holes accumulated in the body region turn on a parasitic bipolar transistor. With the bitline low, the barrier between the bitline diffusion and the body is lowered causing holes from the body (pseudo base) to be injected into the bitline diffusion (pseudo emitter) and electrons from the bitline diffusion to be emitted into the body. These electrons are collected by the space charge region adjacent to the node diffusion, resulting in the loss of a stored high level. Thus, the wordline has lost the ability to keep the device off. The device continues to conduct strongly for as long as the bitline remains low or until the body is depleted of the holes it has stored, which may be several milliseconds.

Applicants have also found that parasitic bipolar conduction may also occur in the grounded source configuration as the result of holes generated by drain avalanche. These holes supply the parasitic base current, which aggravates device leakage and could lead to device latch up and hysteresis effects.

A paper, "Body Contacts for SOI MOSFETs," by M. Matloubian published in the Proceedings of the Electrochemical society Conference, May, 1992, reviews problems arising from conventional floating body SOI devices and describes schemes for making contact to the body from the surface. However, as the paper points out, these schemes introduce both area and speed penalties. Commonly assigned U.S. Pat. No. 5,055,898 to Beilstein et al., ("the '898 patent") discloses structures for coupling the active device regions to the substrate or to the surface to reduce or eliminate the floating body effect. However, as the '898 patent mentions, the structure providing contact between body and substrate requires a significantly larger cell size for a DRAM cell, detracting from yield and adding to cost. And these structures require the use of additional minimum dimension masks and expensive processing steps for their formation.

Applicants have found a structure and process to provide a body contact that avoids all the above problems, eliminates the floating body problems, permits the device to become fully depleted, and uses little chip surface area. The body contact of the present invention is called a body-to-substrate connection.

Single crystal semiconducting wafers used in the processes illustrated in FIGS. 2–3 are formed from materials such as silicon, germanium, and gallium arsenide. Because silicon is most widely used and the most is known about its etch properties, silicon will be used for illustration hereinbelow. The wafer may have had implants, diffusions, oxidations, and other process steps completed before embarking on the process sequences described hereinbelow. The wafer has a planar surface in which silicon-on-insulator FETs are built. Prepositions, such as above, below, beneath, under, over, upper, lower, etc. are defined with respect to this planar surface being on the top surface of the chip or wafer, regardless of the orientation the chip is actually held. The term "horizontal" as used in this application is defined as a plane parallel to the conventional planar surface of a semiconductor chip or wafer, regardless of the orientation the chip is actually held.

A first embodiment of the invention is illustrated in FIGS. 2a–2l and the detailed description below. First, in brief, this embodiment has the buried dielectric formed by first implanting a dopant self-aligned to spacers formed on edges of a thick insulating layer formed on the surface of the wafer. One of the spacers and the heavily doped region are then etched out forming a horizontal trench which is then coated or filled with dielectric. The connection between the upper and lower portions of the substrate is under thick insulation defining an edge of this horizontal trench. The gate of the FET is formed in the region between the spacers, and so an edge of the gate is substantially co-aligned with the connection to substrate. The distance the connection is spaced from the gate is approximately the distance the edge of the vertical portion of the connection closest to the gate is spaced from the gate.

Figure 2A:
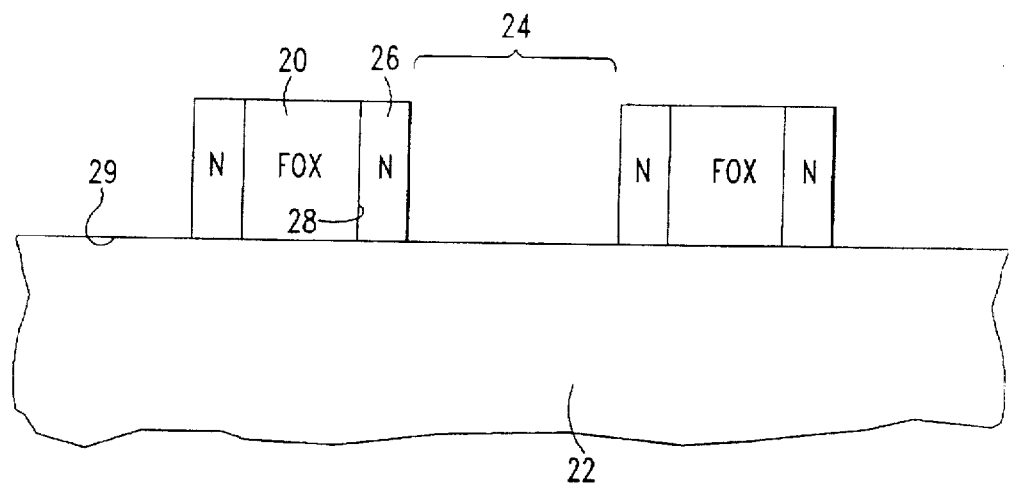

As illustrated in FIG. 2a, insulating layer 20, such as CVD field oxide (FOX), is deposited by conventional means on silicon substrate 22 in the first step. Insulating layer 20 can also be formed by thermal oxidation of substrate 22. Various other insulating materials can also be used. Using standard photolithography, elongated grooves 24 are then etched in insulating layer 20 leaving stripes of insulating layer 20 (see FIG. 2f for top view). Next, spacers 26 are formed on sidewalls 28 of grooves 24 in insulating layer 20. The spacers are formed of a material with different etch properties than insulating layer 20, including materials such as silicon nitride or boron nitride, by a conformal deposition followed by a directional etch that removes material on horizontal surfaces, leaving silicon surface 29 exposed.

Figure 2B:
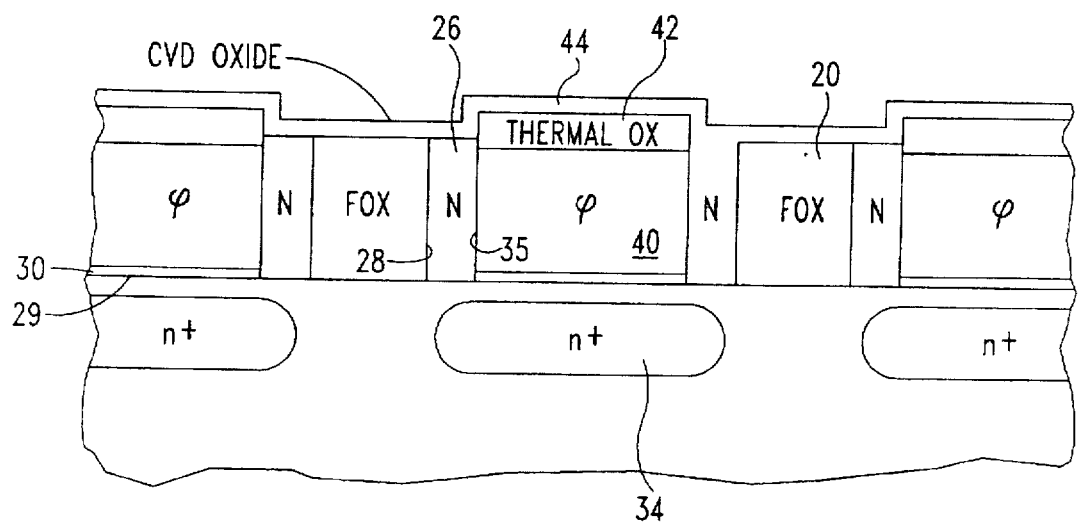

In the next steps, illustrated in FIG. 2b, thin thermal oxide 30 is grown on exposed silicon surface 29 in grooves 24 between spacers 26. Then an n-type dopant such as arsenic or phosphorous is implanted into the silicon through thin oxide 30 and between spacers 26 to form buried n+ layer 34. In a preferred example, arsenic is implanted with a dose on the order of $10^{15}$ per cm$^2$ and an energy in the range of 450 KeV through a 100 A screen oxide into a silicon substrate doped at about $5 \times 10^{17}$ per cm3. Simulations of implants at several energies are illustrated in FIG. 2m–2n. The implant is tailored so that the junction formed closest to the silicon surface is approximately where the top edge of the insulator is desired. As shown in FIGS. 2m and 2n, the implant provides an SOI silicon film 240 A thick, an arsenic doped region with a thickness of around 5600 A, and, as a result of the horizontal straggle of the implant, the doped region is spaced laterally a distance of about 1850 A beyond the mask edge, which in this case is the outer edge 35 of spacer 26 (which in addition to providing the mask edge for the present implant will also later define the edge of the gate conductor).

A material with a third etch property, such as polysilicon, is then deposited and polished back to the top of insulating layer 20 to form mandrel 40. Oxide film 42 is then formed on top of mandrel 40 by methods such as thermal oxidation. CVD oxide film 44 is then deposited.

Figure 2C:
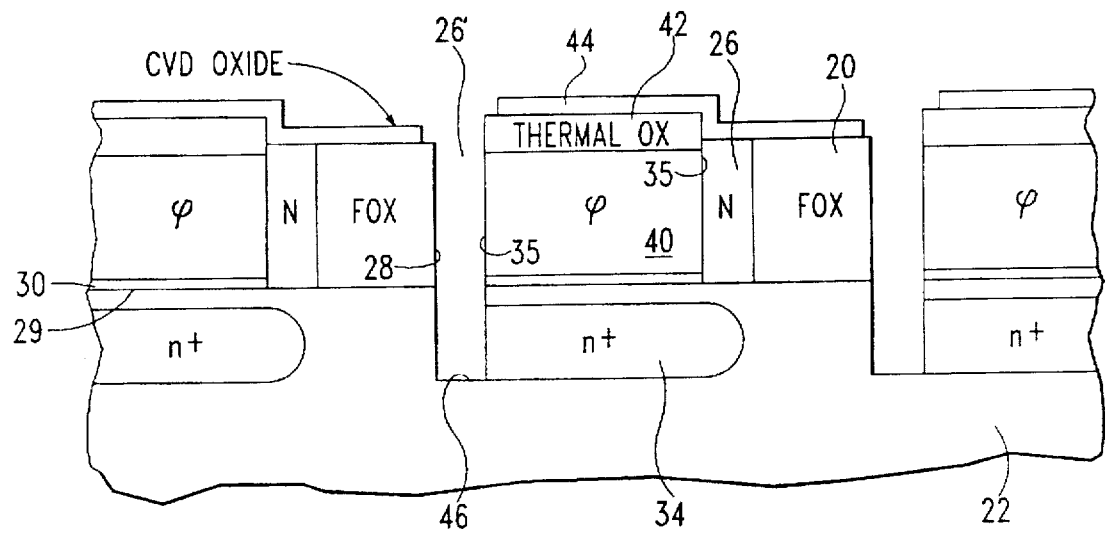

Next, CVD oxide 44 is photolithographically masked and etched as shown in FIG. 2c to open up windows at alternate nitride spacers 26'. CVD oxide etches much faster than thermal oxide, so thermal oxide film 42 is little effected by the etch of CVD oxide 44. Now alternate nitride spacers 26' are dip etched out. The silicon thereby exposed is RIE etched to form vertical trench 46, which intersects n+ buried region 34. Thermal oxide 42 protects mandrel 40 during this RIE etch step. Trench 46 aligns with n+ buried region 34 because the n+ implant was self-aligned to spacers 26.

Figure 2D:
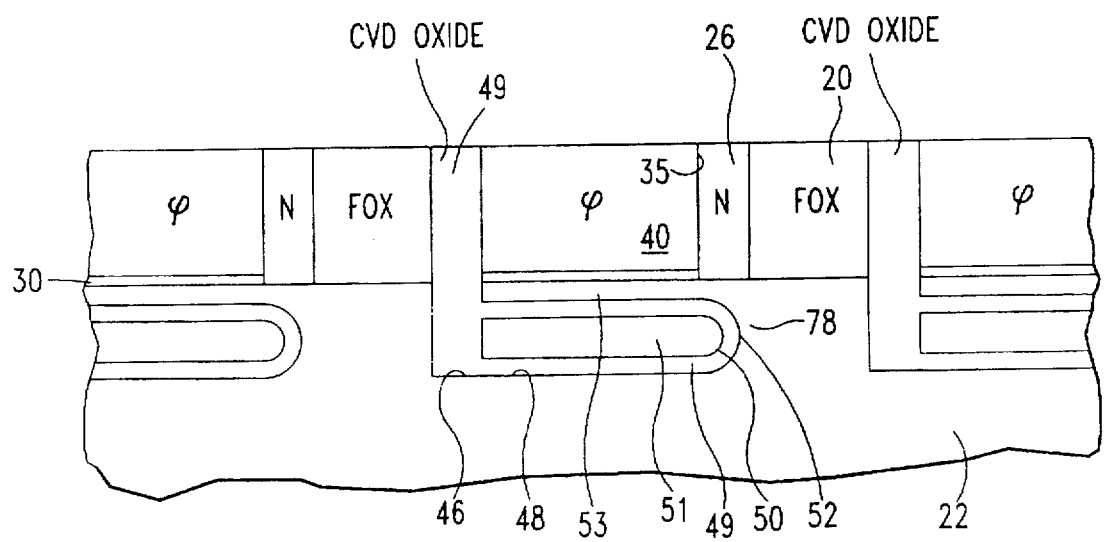

An etchant that preferentially attacks n+ silicon, such as a solution of HF, HNO$_3$, and CH$_3$COOH at a 1/3/8 ratio is used to hollow-out n+ layer 34, forming horizontal trench 48 illustrated in FIG. 2d. This etch is used to hollow out an n+ layer in a paper by Horie et at., "A New SOI Fabrication Technique for Ultrathin Active Layer of Less than 80 nm," 1990 VLSI Technology Symposium. Horizontal trench 48 can also be formed by methods such as crystallographic etch and by a porous silicon etch of a p+ layer (formed by implant of boron instead of arsenic) described in a commonly assigned co-pending patent application by Don Kenney filed on Aug. 11, 1994 incorporated herein by reference. The horizontal trench extends to the junctions of the implant species, and thus extends beyond inner edges 35 of spacers 26.

Insulator 49, having a low dielectric constant, such as thermally oxidized silicon or CVD oxide, is then deposited lining horizontal trench 48, forming buried insulator 50, and filling connecting vertical trench 46. Horizontal trench 48 may be completely filled with insulator 49 if its height is less than or equal to the width of vertical trench 46. However, an improved dielectric is formed if gap 51 is left in horizontal trench 48 as shown in FIG. 2d, since a gas or vacuum has a lower dielectric constant than available solid insulators. A dielectric effectively thicker than deposited insulator 49 can thereby be formed. The lateral straggle of the arsenic implant automatically provides that buffed insulator 50 extends horizontally beyond inner edges 35 of spacers 26. Thus, electrical connection 78 at edge 52 of trench 48 is far from the edge of the gate conductor capacitor plate that will be formed in a subsequent step.

Figure 2E:
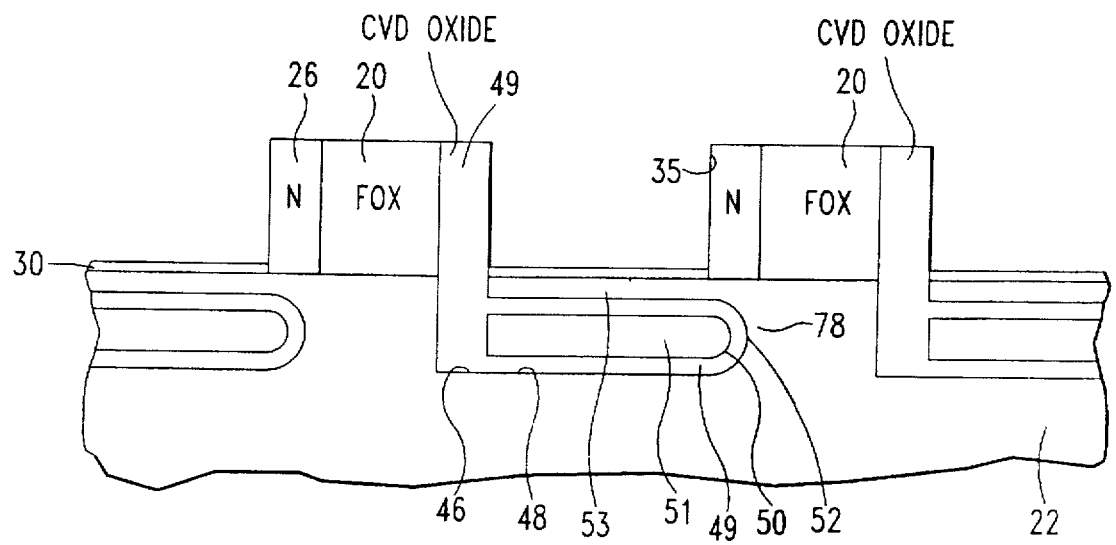

In the next step, a nonselective etch can be used to remove oxide films 49 and 42 over mandrel 40. This is followed by a planarization process, such as chemical-mechanical polishing, to provide a planar surface and expose polysilicon 40 as shown in FIG. 2d. Polysilicon 40 is then dip etched out as shown in FIG. 2e leaving thin oxide 30 over thin silicon 53.

Figure 2F:
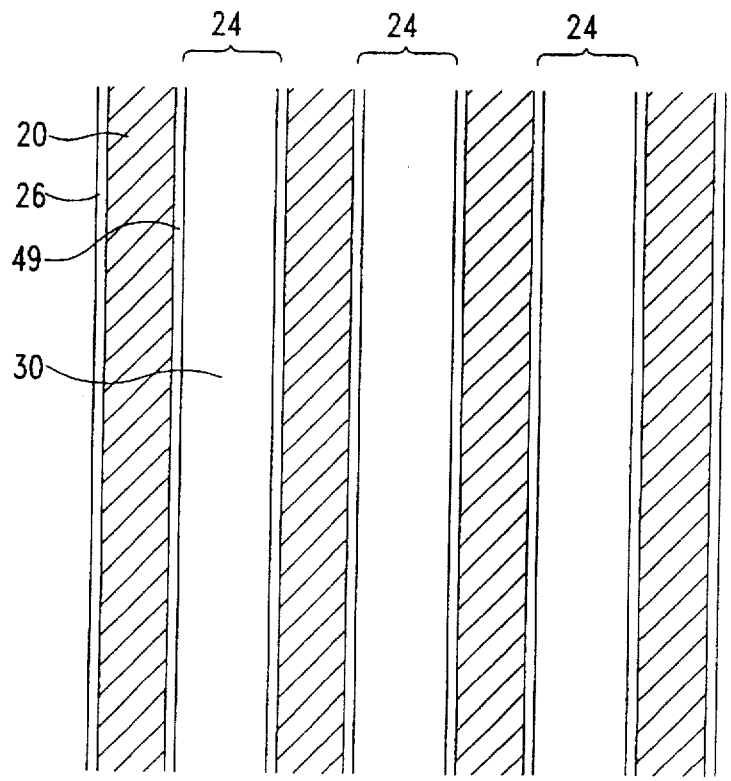

FIG. 2f shows a top view of the structure at this point in the process showing elongated grooves 24 of SOI covered by thin oxide 30 located between stripes of insulating layer 20. The stripes of insulating layer 20 have alternate nitride spacers 26 and CVD oxide spacers 49 adjacent to insulating layer 20, spacers 49 extending down to horizontal trench 48.

As illustrated in FIG. 2g, active areas within grooves 24 are next defined by a mask. In unprotected areas 56 within grooves 24 thin oxide 30 and thin silicon 53 (see FIG. 2e) are etched down to horizontal trench 48, providing isolation between what will become source drain electrodes of adjacent transistors within groove 24. Areas 56 will be lined with insulator 64 as described below (see FIG. 2j).

If needed, thin silicon 53 is implanted to provide a desired channel doping profile. Typically a boron concentration on the order of $10^{17}$ to $10^{18}$ per cm$^3$ in the body region is desired, and this is achieved by standard implant and anneal. As illustrated in FIG. 2h and 2i, thin thermal oxide 30, previously formed on silicon surface 29, is removed. Next, gate dielectric 60 is formed by conventional means on exposed silicon surface 29 between spacers 26 and 49. Gate conductor 62 is then deposited and planarized using methods such as chemical-mechanical polishing, stopping on top of remaining nitride spacers 26. A mask is then formed using photoresist, and the gate conductor is etched back within grooves 24 except in mask protected regions 62'. Gate dielectric 60 is exposed by the etch in other regions of groove 24.

Figure 2J:
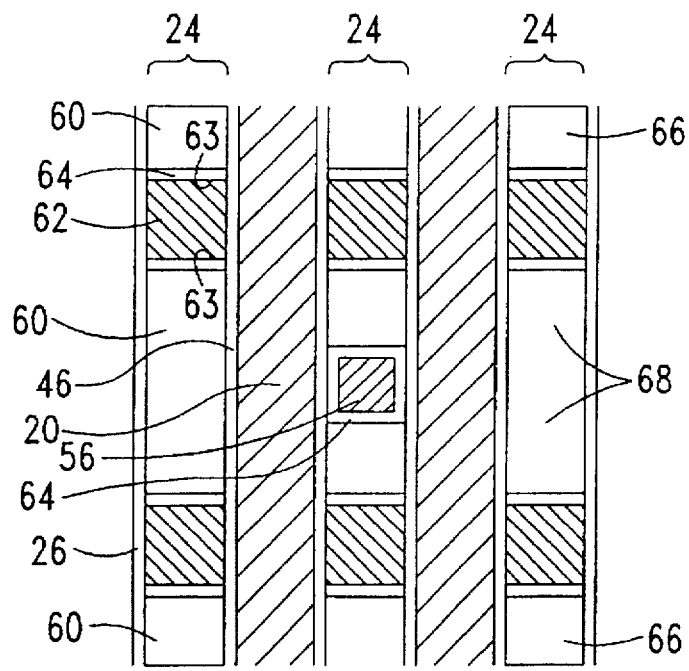
Figure 2K:
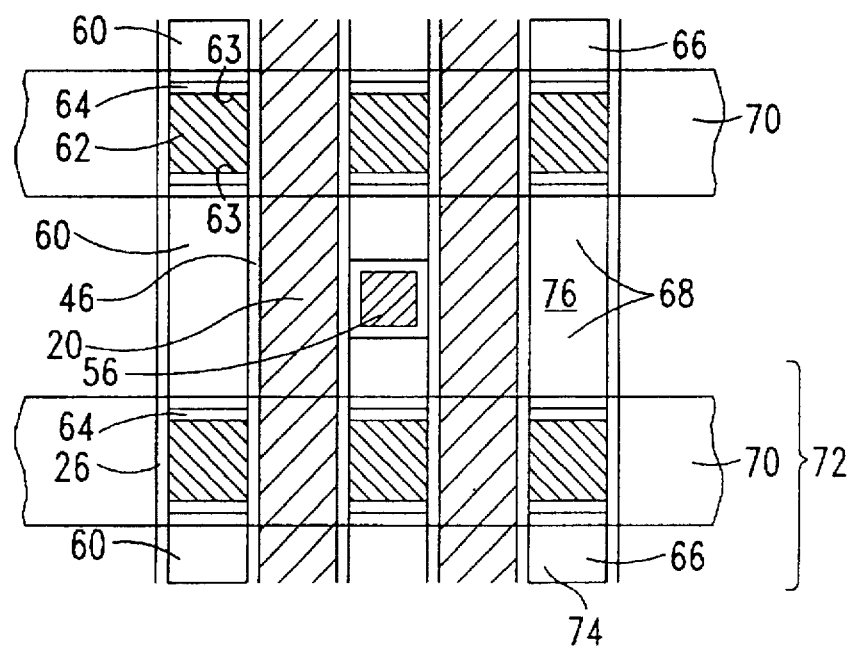

In the next step, illustrated in FIG. 2j, insulation is conformally deposited and spacer etched to provide insulating spacer 64 on the two mask-defined sides 63 of gate conductor 62 within groove 24. Insulating spacer 64 is formed from a material such as CVD oxide. A blanket implant is then provided for self-aligned source/drain diffusions 66 and 68, providing dopant in the active area unprotected by gate conductor 24, spacer insulator 64, spacers 26 and 49, and insulating layer 20. As is known in the art, dopant for the source/drain diffusions can also be diffused from a deposited material, such as doped polysilicon. The wafer is then annealed in a process known in the art to activate the dopant. Gate connectors, such as word-lines 70, are now deposited and photolithographically defined as shown in FIG. 2k, making contact to each gate conductor 62. The gate connectors are fabricated from standard materials such as doped polysilicon, tungsten, and aluminum. Finally, contacts as needed for the source and drain are formed in the conventional manner (not shown). The result is SOI transistor 72 with body-to-substrate electrical connection 78 provided under insulating layer 20 and spacer 26 as illustrated in FIGS. 2i–2l (insulating layer 20 and spacer 26 are omitted for clarity in FIG. 2l).

Transistor 72 is used in applications including logic and memory. For example in FIG. 2k, terminal 74 of transistor 72 can be connected to a standard trench or stacked capacitor (not shown) by conventional means while a bitline is connected to terminal 76 to form the array device of a DRAM cell.

Figure 2L:
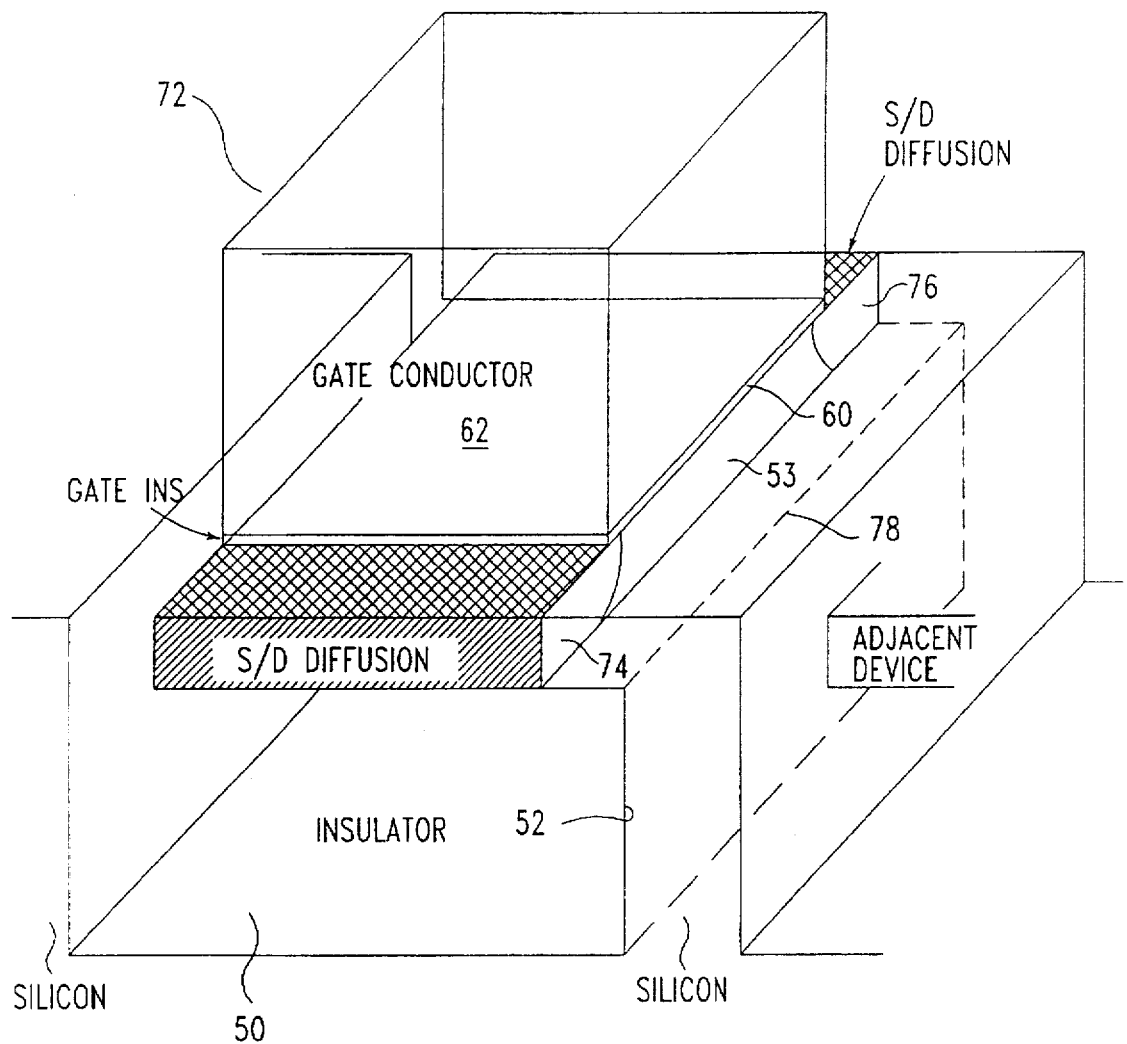
FIG. 2l is a schematic perspective view of a device of the present invention.
Figure 2M:
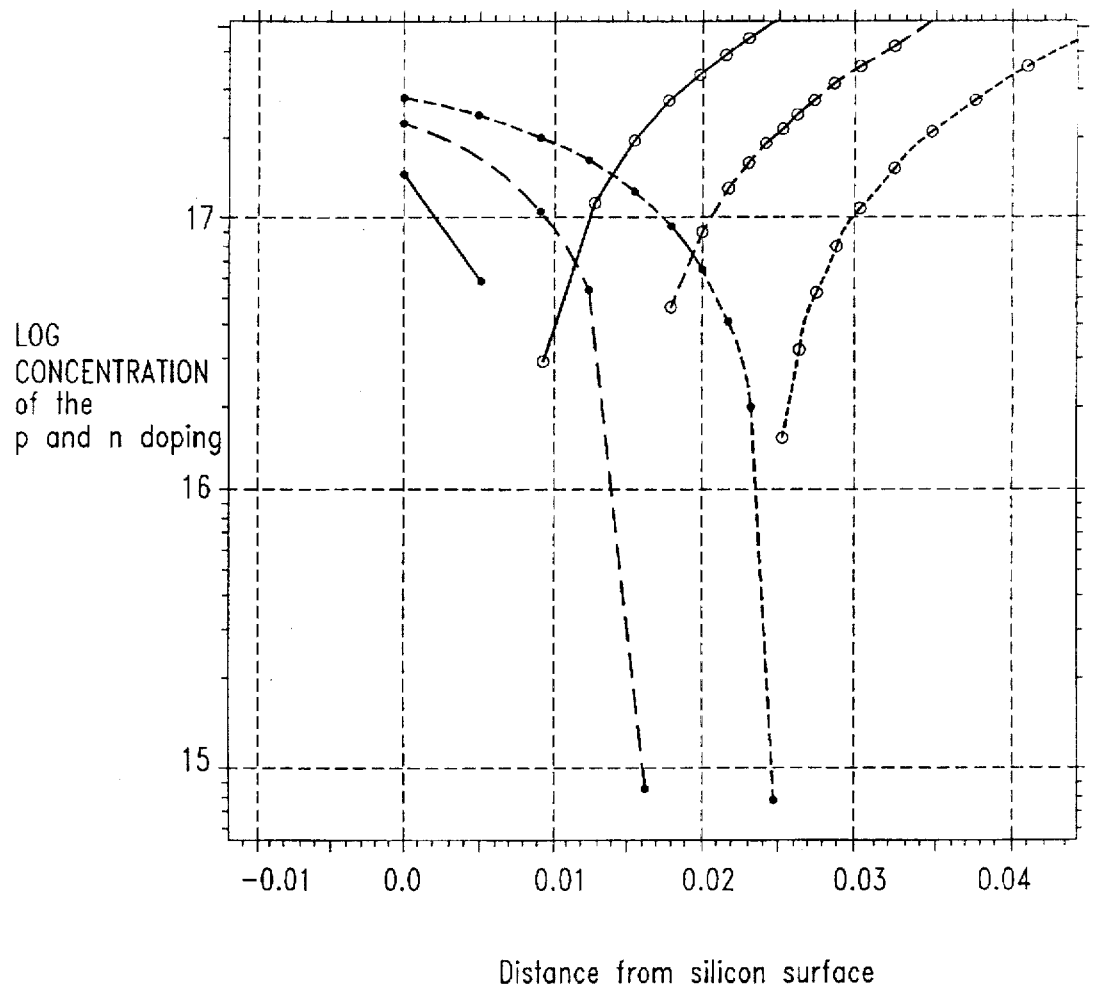
FIGS. 2m–2n are the results of simulation of ion implants showing the junction depth and the location and configuration of the buried insulator.
Figure 2N:
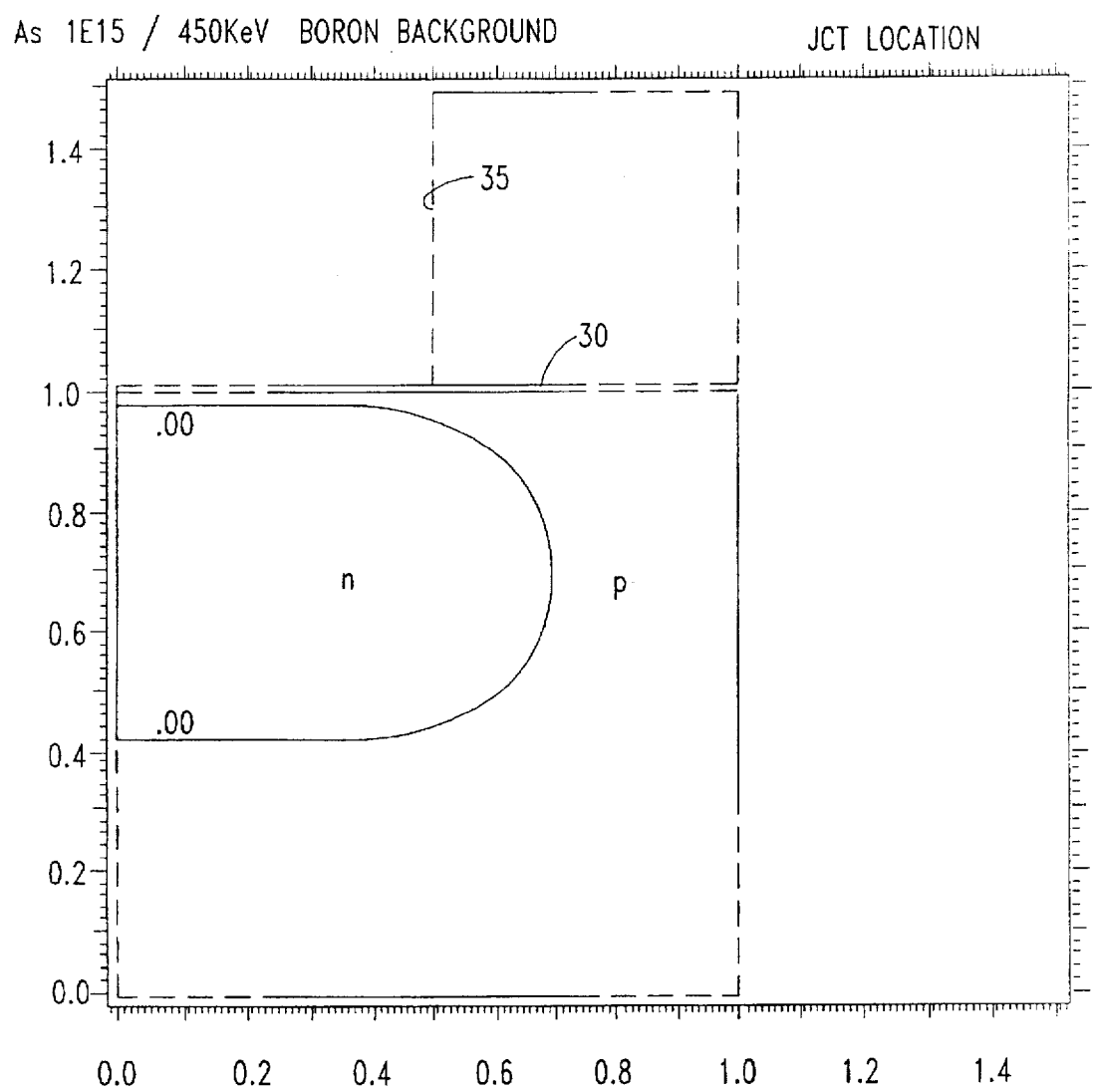

Shown in FIG. 2l is a transistor of the present invention having a body-to-substrate connection adjacent to the transistor on a side not occupied by the source or drain diffusion. Thick insulating layers 20 and 26 (not shown for clarity) are adjacent gate conductor 62 between electrical connection 78 and an overlying gate connector 70 (see FIGS. 2k and 2i) that makes contact to gate conductor 62. And the connection is spaced from the gate conductor because of the straggle of the arsenic implant. This spacing can be increased or decreased by methods such as providing an additional spacer adjacent spacers 26 before the n+ implant or before the gate conductor is deposited. Thus, the gate electric field coupling to charge in the body-to-substrate connection region is substantially reduced compared to contacts located under the gate. As illustrated in FIG. 2l, source and drain diffusions 74 and 76 are on other sides of gate 62 than body-to-substrate electrical connection 78. Because electrical connection 78 at edge 52 of buried insulator 50 is substantially co-aligned with gate conductor 62, and since no critical photolithography step is needed for the formation of substrate connection 78, the provision of connection 78 adds negligibly to chip surface area.

Figure 3A:
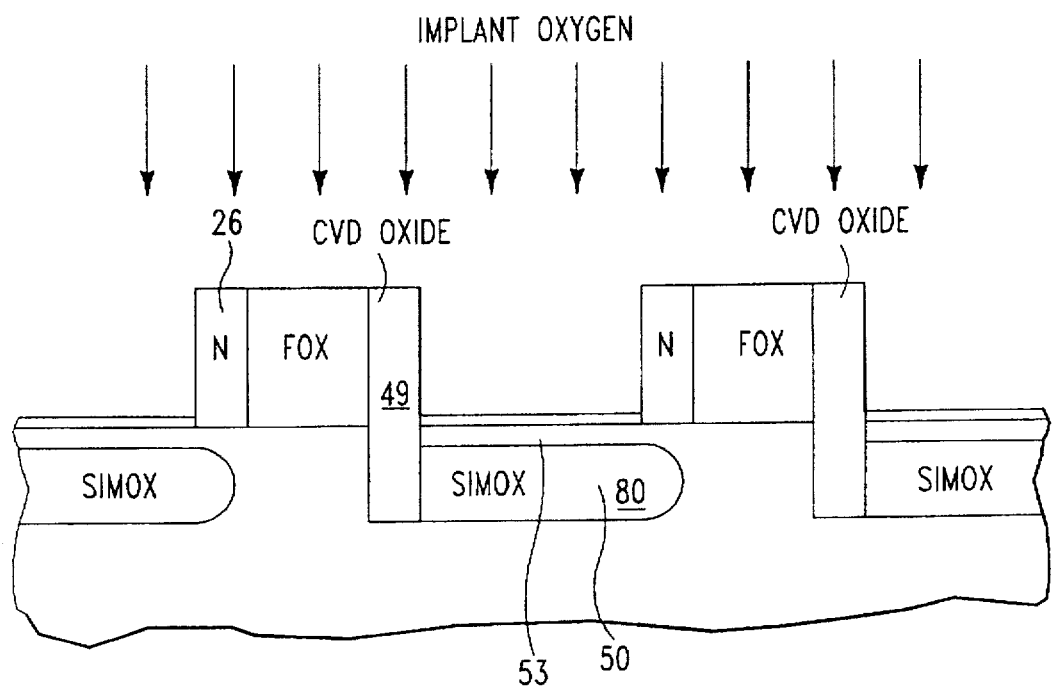
FIGS. 3a–3b are cross-sectional views showing the structure at several steps in the process for making an SOI device of the present invention on a standard substrate using a SIMOX implant.
Figure 3B:
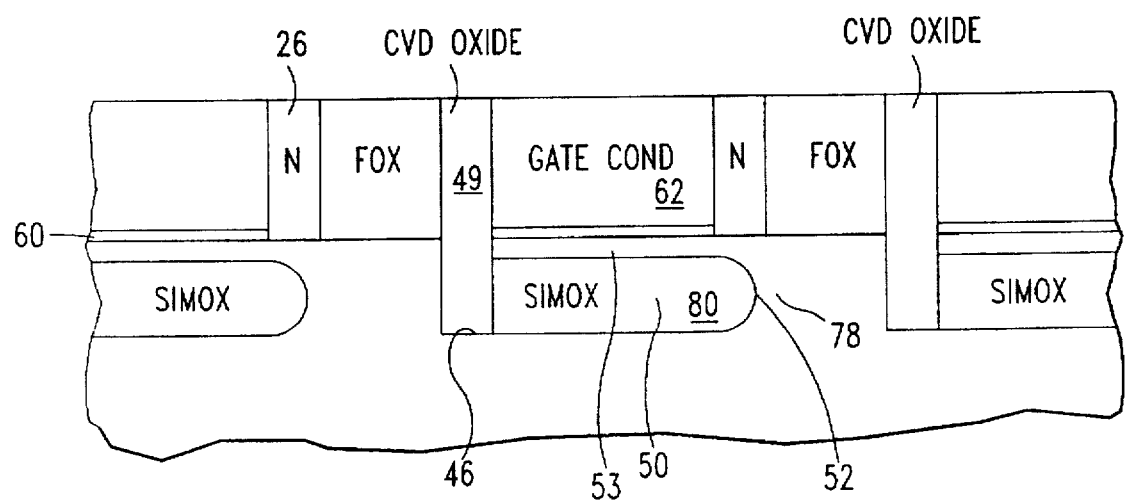

Alternate methods can be used to form buried insulator 50 including "Separation by implanted oxygen" (SIMOX). This second embodiment differs from the process described above in that no n+ implant and horizontal trench need be formed. Instead, as shown in FIG. 3a, oxygen ions are implanted with a dose on the order of 1×10$^{18}$/cm2 at an energy of about 200 KeV. Annealing for about 6 hours at 1300° C. provides monocrystalline silicon film 53 with a thickness of about 1000 Å on SIMOX insulator 80. The oxygen implant is tailored so that the oxygen-silicon junction formed closest to the silicon surface is approximately where the top edge of SIMOX insulator 80 is desired. The implant is performed either as in the first embodiment, before polysilicon 40 is deposited (see FIG. 2a–2b), or it is performed after nitride spacer 26 has been removed, vertical trench 46 has been etched, CVD oxide 49 has been deposited in the vacant spacer, and polysilicon 40 has been removed (FIGS. 2c–2e and FIG. 3a). Gate dielectric 60 is then grown and gate conductor 62 deposited as illustrated in FIG. 3b and as in the first embodiment.

In this second embodiment a spacer need not be removed to etch out a buried horizontal trench and then to deposit insulator to form the buried dielectric. However, in all embodiments; spacer 26 extending through vertical trench 46 to buried oxide 50 are valuable for providing isolation between adjacent transistors. Punch through is avoided because of the long path thereby achieved between diffusions of adjacent transistors. It will be noted that the SIMOX implant and gate conductor 62 are substantially co-aligned with the edge of spacer 26. Of course, there will be lateral straggle of oxygen ions, so edge 52 of buried insulator 50 will actually be spaced beyond the edge of gate conductor 62, as will connection to substrate 78.

In a third embodiment, illustrated in FIGS. 4a–4f, SOI wafers having a blanket layer of buried insulator extending substantially across the wafer are used as the starting material. To summarize the process presented in more detail below, the SOI is divided into mesas in a masking step, and the etch goes all the way through the buried dielectric to the lower portion of the silicon substrate. Then a silicon connection is formed between the lower and upper portions, preferably by epitaxial growth. The silicon connection region remains unmasked, and is oxidized. Gates are formed between these oxide isolations. Thus, the connection between upper and lower portions is substantially co-aligned with a side of the gate.

Figure 4A:
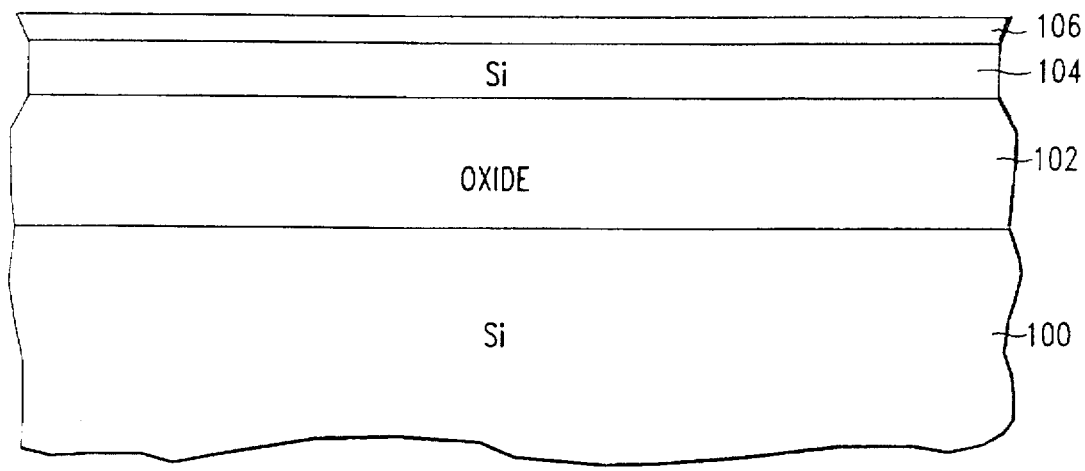
FIGS. 4a–4f are cross-sectional views showing the structure at several steps in the process for making an SOI device of the present invention on a blanket SOI substrate.

The blanket SOI wafers are shown in FIG. 4a comprising substrate 100 having buried insulator 102 and thin layer of single crystal silicon SOI layer 104. A suitable method for forming the blanket SOI layer is described in an article entitled "Silicon-On-Insulator (SOI) by Bonding and Etch-Back," by J. B. Lasky, et al., presented at the IEDM Conference, December, 1985. Blanket SOI wafers can be formed by providing a blanket oxide on one of the major wafer surfaces. Then, this major surface is bonded to a second wafer, and either the second major surface of the first wafer is thinned or the second wafer is thinned to provide the desired thickness of SOI. The SOI film can vary from about 5 nm to about 500 nm. After standard cleaning steps, conventional pad dielectric 106 is deposited. Pad dielectric 106 is formed of a material such as thermally grown or deposited silicon nitride or a composite film comprising a lower layer of thermally grown or deposited silicon dioxide and an upper layer of silicon nitride. Nitride thickness is determined by what is needed to stand up to subsequent polishing and etching steps, about 50 to 100 nm. Pad oxide is in the range of 100 nm thick.

Figure 4B:
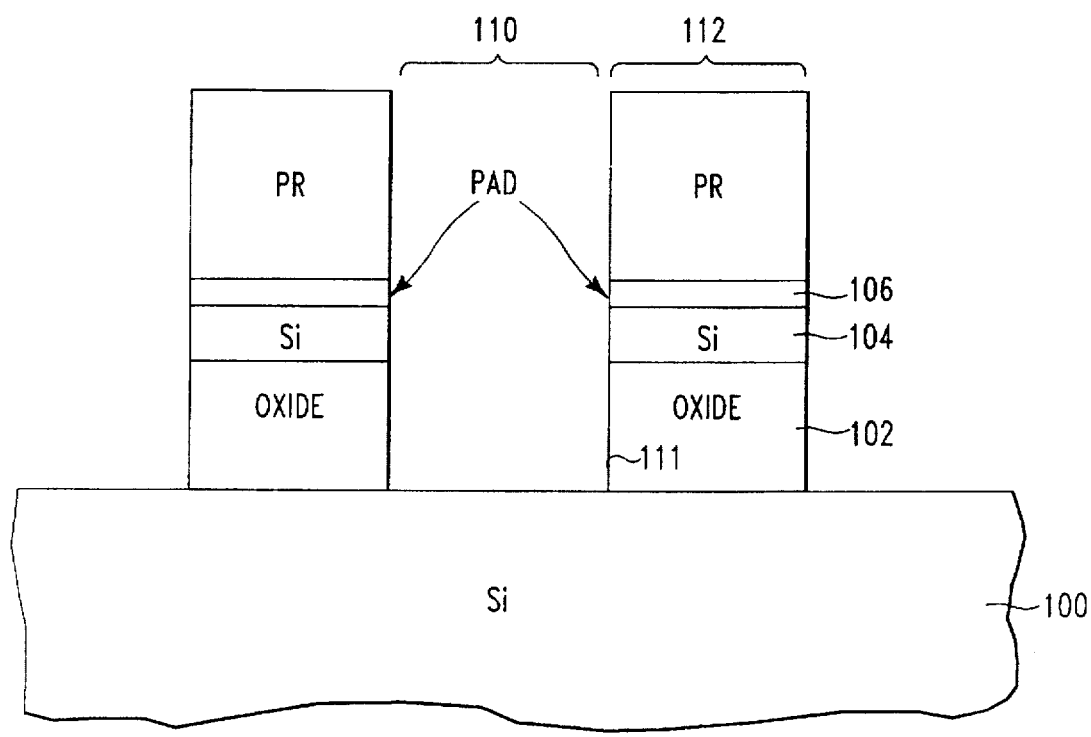

As illustrated in FIG. 4b, photoresist 108 is deposited and patterned. Elongated grooves 110 are then etched in pad dielectric 106, SOI layer 104 and buried insulator 102 between SOI pedestals 112. Grooves 110 have sidewall 111.

Figure 4C:
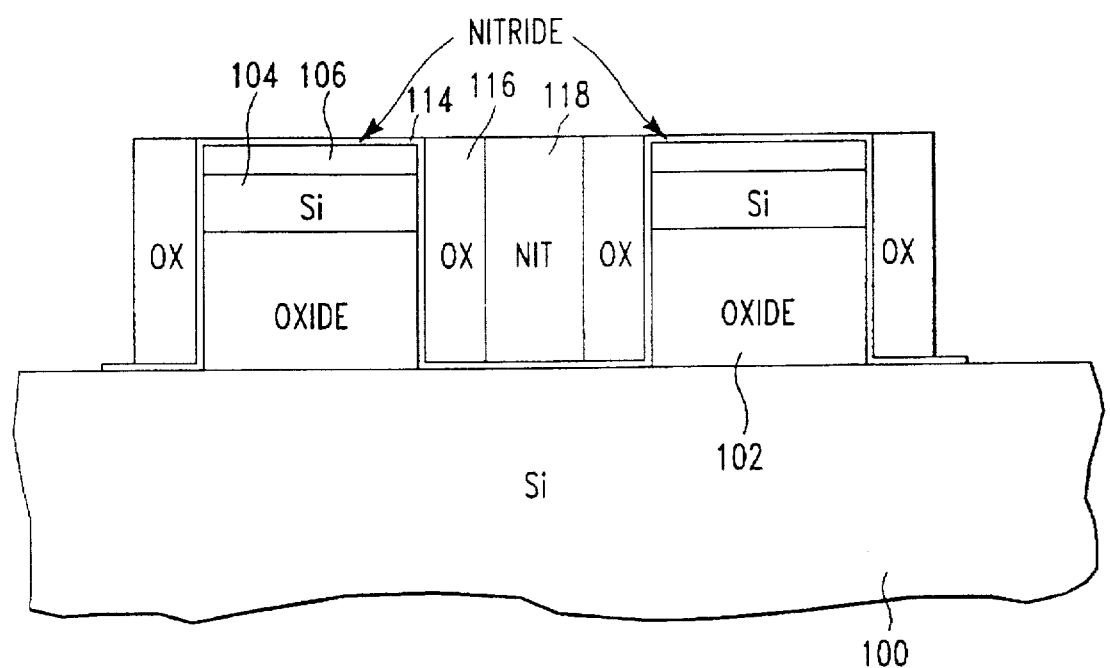

As illustrated in FIG. 4c, insulating layer 114 is conformally deposited. Insulating layer 114 is formed from a material such as silicon nitride having a thickness from about 10 to about 200 nm. Spacers 116 are next formed of a material such as silicon dioxide by a process as described hereinabove. Insulating material 118, formed from a material with etch properties different than those of spacers 116, such as silicon nitride or boron nitride, is then deposited filling the gap between spacers 116. Insulating material 118 will provide isolation between adjacent transistors as further described below. The wafer is then planarized using techniques such as chemical-mechanical polishing, stopping on insulating layer 114.

Figure 4D:
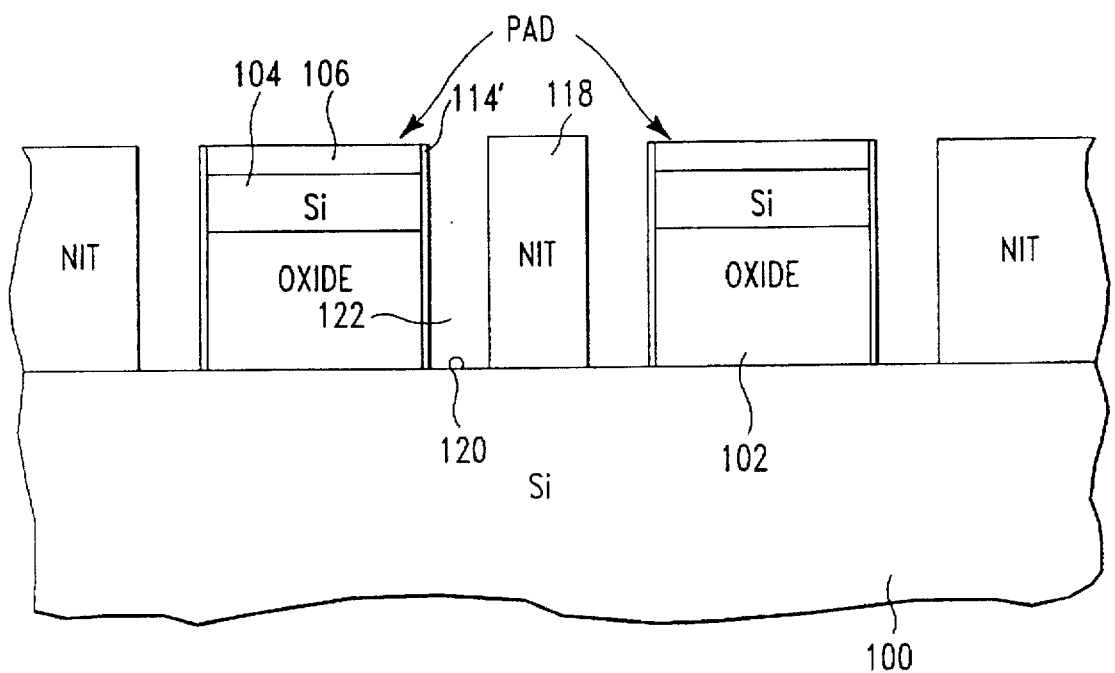

In the next step, spacers 116 are etched out either with an isotropic or anisotropic etch, as illustrated in FIG. 4d. Insulating layer 114 is then exposed to a directional etch, forming spacers 114' along sidewall 111 and exposing bare silicon 120 of substrate 100 at the bottom of now empty spacer region 122 as illustrated in FIG. 4d.

Figure 4E:
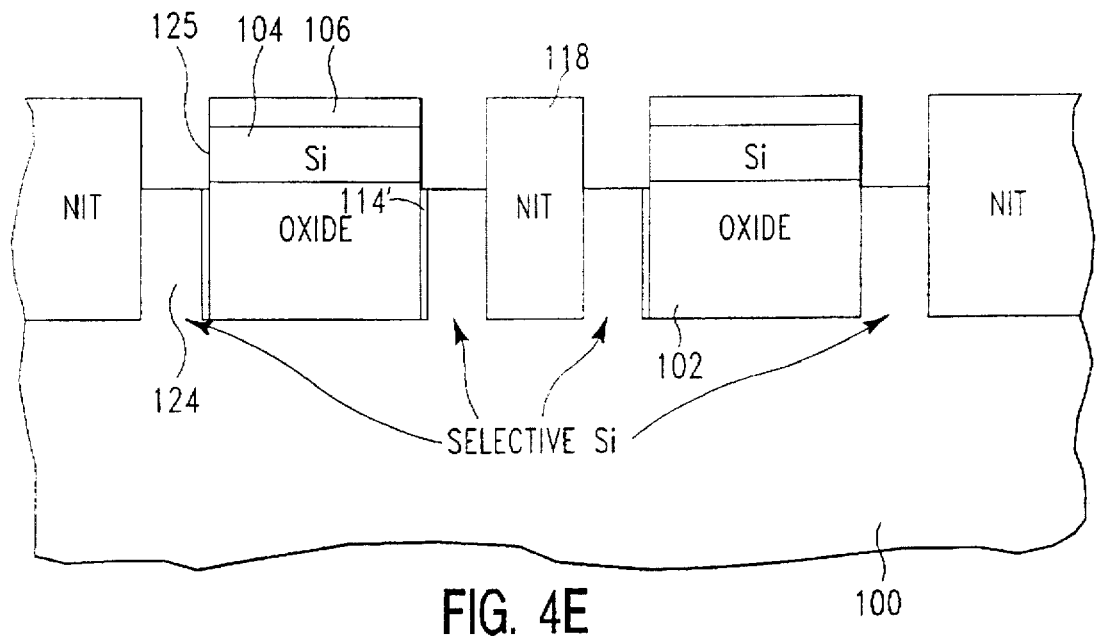

As shown in FIG. 4e, spacer regions 122 are next filled with a material such as photoresist 124. The photoresist is then recess etched to expose portions of spacers 114'. Exposed portions of spacers 114' are now etched away, exposing bare silicon sidewalls 111 of silicon SOI layer 104. Remaining photoresist 124 is then removed.

Figure 4F:
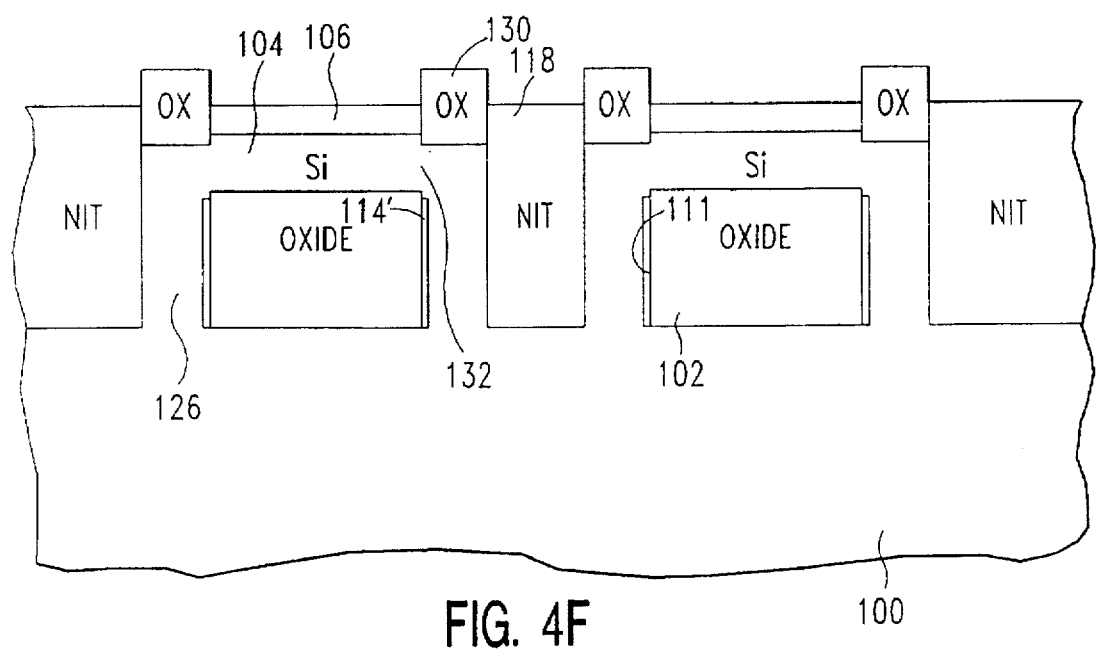

Next, monocrystalline or polycrystalline silicon 126 is epitaxially grown or deposited to connect silicon sidewalls 125 of silicon SOI layer 104 with silicon 120 of substrate 100 at the bottom of spacer region 122 as illustrated in FIG. 4f providing the desired body-to-substrate connection. In-situ p-doped monocrystalline silicon is grown epitaxialy, seeded from bare silicon 120 and exposed sidewall 125 and extending through spacer region 122 along sidewall 114'. Alternatively, polycrystalline silicon is deposited along sidewall 114' to interconnect silicon 120 and sidewall 125.

The use of monocrystalline selective silicon as the connection provides significant advantages over polysilicon or other possible conductive materials. Monocrystalline selective silicon provides means to avoid high junction leakage currents at the interface of source/drain diffusions and the body region of an FET. However, the use of polysilicon, even within reach of the drain depletion region is possible. Polysilicon PFETs are commercially manufactured for thin film transistor cells, for example, and these achieve sufficiently low leakage currents for use in logic and SRAM.

A planarization step such as a chemical-mechanical polish is then performed stopping on pad dielectric 106. Thick oxide 130 is then grown on exposed silicon in spacer regions unprotected by pad 106 as also shown in FIG. 4f. The result is SOI 104 with body to substrate connections 132 on two sides of SOI layer 104, the connections both provided under thick oxide 130.

Since thick oxide thermally grown adjacent to a nitride protected pad is formed with a bird's beak, or region of thickened oxide extending under the nitride of the pad, a gate dielectric formed in the space between regions of thick oxide may be shifted slightly away from sidewall 111, decreasing the capacitive coupling between a later formed gate and substrate connections 132. This coupling is also reduced by the presence of insulator 114 along sidewall 111 spacing the vertical portion of connection 132 further from the gate edge. Clearly, the process could be simplified by eliminating insulator 114, and, especially for wide devices, the increased capacitive coupling to the substrate may not warrant this complexity and the inclusion of insulator 114.

The same sequence of process steps as described hereinabove and illustrated in FIGS. 2g–2l is performed to fabricate transistors in SOI layer 104 between regions of thick oxide 130. As in the previous embodiments, insulator 118 provides isolation between adjacent transistors-the path down to the substrate, around insulator 118 and up to the adjacent device is sufficiently long to avoid punch-through problems with reasonable substrate doping. The location of sidewall 111 of buried insulator 102 is defined with significantly more precision in this embodiment than in the first two embodiments. In those embodiments, the edge of the buried insulator was determined by the straggle of implants-which as mentioned above is as much as 1850 Å—limiting the degree to which devices can be scaled to smaller dimension. In this third embodiment, however, sidewall 111 is determined photolithographically and spacer 114 can be on the order of ten nanometers thick or omitted entirely. Thus the substrate connection can be located at a desired distance from gate edge to reduce capacitive coupling to the substrate while still providing tight geometries. And, this embodiment appears to be scalable to smaller dimensions than embodiments with buried insulator formed from an implant.

Figure 5:
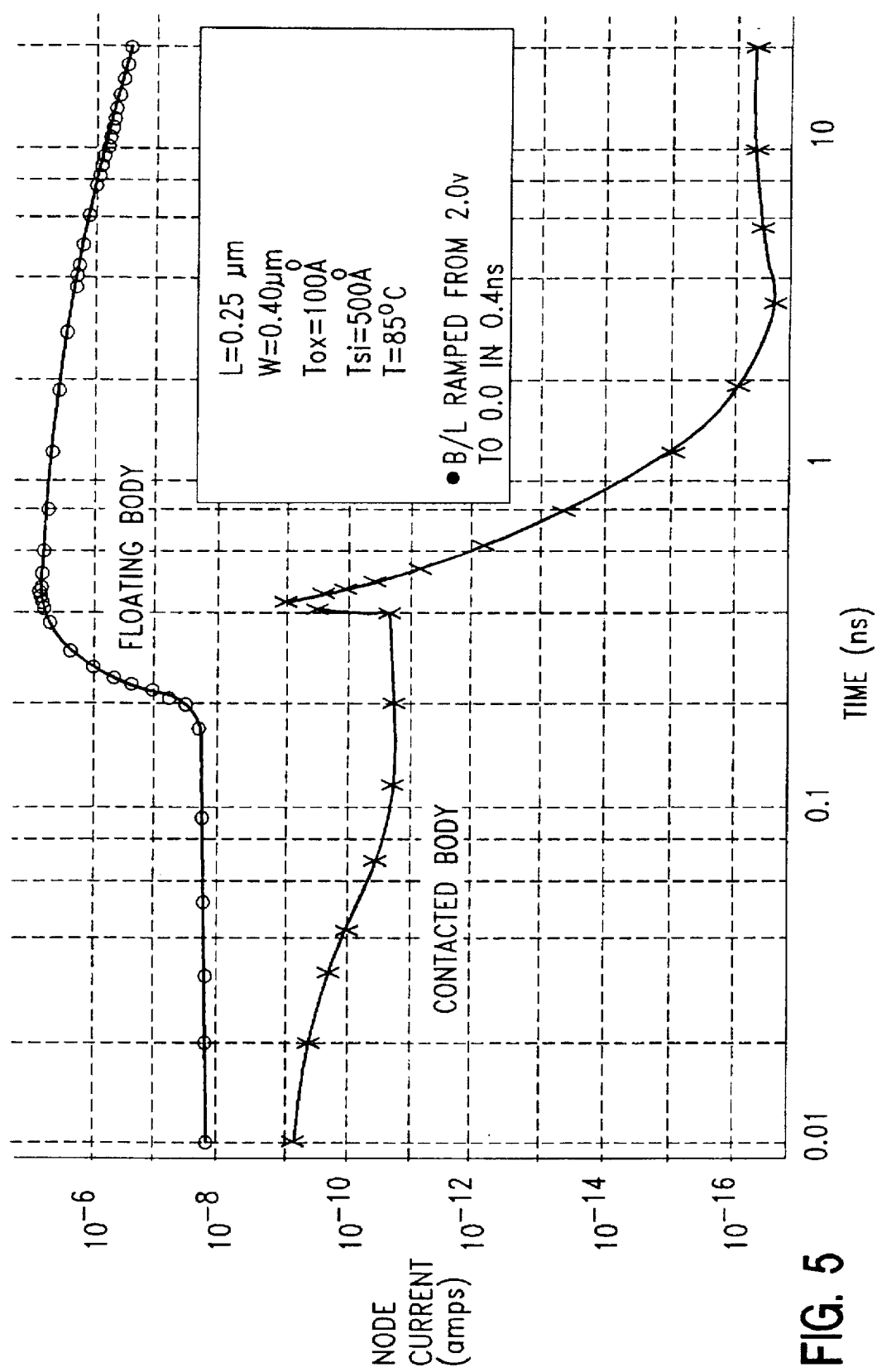
FIG. 5 is a graph showing improved electrical characteristics of the device of the present invention compared to a standard SOI device.

Simulated electrical characteristics of a device of the present invention compared with a standard SOI device without body-to-substrate contact are shown in FIG. 5. It is seen that the device with floating body continues to conduct (because of the bipolar parasitic transistor) whereas the contacted body device current drops sharply soon after the bitline voltage is ramped to ground potential.

The invention provides significant savings in chip area compared to schemes having the body contact extending to the surface. For example, for a DRAM cell comprising a bitline contact, a MOSFET, and a capacitor, an extra photolithographically formed contact to the surface from the body of the MOSFET could add 30 to 50% to cell area. For an SRAM, if contacted bodies are required for all six MOSFETs, then this invention would result in a density increase of roughly 20 to 30%. For random logic typically a logic bay is on the order of 35 to 100 times the minimum feature size. The body contact of this invention provides about 4 times the minimum feature size of relief for each device, and thus a density increase of 4 to 12% if both p-well and n-well contacts are made according to the present invention. The invention provides advantage over bulk CMOS in this regard since in bulk CMOS local contacts to at least one well are typically required for latch-up immunity, and these take up surface area. In SOI local contacts to the well would not be required, allowing significant area advantage to the body contact of the present invention.

While several embodiments of the invention, together with modifications thereof, have been described in detail herein and illustrated in the accompanying drawings, it will be evident that various further modifications are possible without departing from the scope of the invention. For example, a similar structure and process is used for forming body connections in substrates other than silicon. Also, the insulating and conductive materials described here are illustrative and various materials known in the art can be substituted for them. Nothing in the above specification is intended to limit the invention more narrowly than the appended claims. The examples given are intended only to be illustrative rather than exclusive.

What is claimed is:

1. A method of forming a silicon-on-insulator FET comprising the steps of:
   a) providing a semiconductor substrate having a buried dielectric, said buried dielectric defining lower and upper regions of said substrate;
   b) forming a connection between said lower and upper regions of said substrate;
   c) forming a gate dielectric on said upper region;
   d) forming a gate on said gate dielectric, said gate having a first side, a second side, and a third side; and
   e) forming a source and a drain in said upper region and leaving a body therebetween, wherein said source is aligned to said first side and said drain is aligned to said second side;
   wherein said step (b) involves forming said connection substantially co-aligned with said third side of said gate.

2. A method as recited in claim 1, wherein said step (b) involves forming said connection so that its position with respect to the gate does not prevent said body from reaching full depletion.

3. A method as recited in claim 1, wherein said step (b) involves forming said connection so that said connection is spaced from said third side of said gate by a distance of less than 200 nm.

4. A method as recited in claim 1, wherein said step (a) involves forming two adjacent buried dielectrics and said step (b) involves forming said connection by leaving a gap between said two adjacent buried dielectrics.

5. A method as recited in claim 1, wherein said step (b) involves forming said connection so that said connection is formed directly below insulation that is substantially thicker than said gate insulator.

6. A method as recited in claim 1, wherein said gate electrode has an electric field when said FET is in normal operation and wherein said step (b) involves forming said connection to a portion of said upper region in which the electric field is substantially smaller than the electric field under said gate electrode.

7. A method as recited in claim 1, comprising the steps of forming said upper region with a thickness, said body with a doping, and said gate conductor with a work function so that said body is fully depleted when said FET is in normal operation.

8. A method as recited in claim 1, wherein said step (a) involves providing an upper region with a thickness in the range 5 nm to 500 nm.

9. A method as recited in claim 1, wherein said step (a) involves forming said upper region by providing a silicon wafer having a first and a second major surface and having a blanket oxide over said first major surface, mounting said first major surface on a support substrate, and etching said second major surface until the silicon is a specified thickness.

10. A method as recited in claim 1, wherein said step (a) involves forming said buried dielectric by one of depositing an insulator in a horizontal trench, thermally oxidizing silicon in a horizontal trench, and forming SIMOX.

11. A method as recited in claim 10, wherein said horizontal trench is formed by implanting a dopant, forming a vertical trench intersecting said dopant, and providing a dopant preferential etch.

12. A method as recited in claim 11, further comprising lining said vertical trench with said insulator.

13. A method as recited in claim 1, wherein said step (a) involves initially forming said buried dielectric as a blanket layer.

14. A method as recited in claim 1, wherein said step (a) and said step (d) involve forming said buried dielectric and said gate of said FET substantially co-aligned.

15. A method as recited in claim 1, wherein said step (a) involves forming said buried dielectric so that said buried dielectric is self-aligned to a first edge, and wherein said step (b) involves forming said connection so that said connection is self-aligned to said first edge, and wherein said step (c) involves forming said gate dielectric so that said gate dielectric is self-aligned to said first edge.

16. A method as recited in claim 15, wherein said edge is defined by a spacer located adjacent to a photolithographically formed thick oxide layer.

17. A method as recited in claim 1, further comprising between steps (a) and (b),
   a1) forming on said substrate an insulating layer formed from a first material with first etch properties;
   a2) forming a pattern in said insulating layer having substantially vertical sidewalls;
   a3) providing spacers adjacent said sidewalls, said spacers formed from a second material with second etch properties;
   and wherein said step (c) involves forming said gate dielectric on said upper region between said spacers.

18. A method as recited in claim 17, wherein said step (a) involves forming said buried dielectric so that said buried dielectric is formed self-aligned to said spacers by ion implantation of one of oxygen and a dopant.

* * * * *